United States Patent
Van Beek

(10) Patent No.: US 7,750,745 B2
(45) Date of Patent: Jul. 6, 2010

(54) OSCILLATOR BASED ON PIEZORESISTIVE RESONATORS

(75) Inventor: Jozef Thomas Martinus Van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 41 days.

(21) Appl. No.: 12/088,722

(22) PCT Filed: Sep. 21, 2006

(86) PCT No.: PCT/IB2006/053413

§ 371 (c)(1),
(2), (4) Date: Apr. 4, 2008

(87) PCT Pub. No.: WO2007/036852

PCT Pub. Date: Apr. 5, 2007

(65) Prior Publication Data

US 2008/0231385 A1  Sep. 25, 2008

(30) Foreign Application Priority Data

Sep. 30, 2005 (EP) ................................. 05109061

(51) Int. Cl.
*H03B 5/30* (2006.01)
(52) U.S. Cl. ............... 331/116 M; 331/154; 331/116 R
(58) Field of Classification Search ............. 331/116 M, 331/116 R, 154, 155
See application file for complete search history.

(56) References Cited

U.S. PATENT DOCUMENTS 6,894,586 B2 * 5/2005 Bircumshaw et al. ....... 333/133
2009/0026882 A1 * 1/2009 Steeneken et al. ........... 310/311

FOREIGN PATENT DOCUMENTS

WO  2004053431 A2  6/2004

OTHER PUBLICATIONS

Sone, Hayato; et al "Picogram Mass Sensor Using Microcantilever", SICE 2004 Annual Conference Sapporo, Japan, IEEE, Aug. 4, 2004, pp. 1514-1519.

* cited by examiner

*Primary Examiner*—Robert Pascal
*Assistant Examiner*—Levi Gannon

(57) ABSTRACT

An oscillator circuit has a first and a second piezoresistive resonator (1,2), each having a resonant frequency, each piezoresistive resonator having an input for driving the resonator, and each piezoresistive resonator having its input coupled directly to an output of the other of the resonators, to provide feedback according to a resistance of the respective resonator without amplification and without a phase shifter. This enables feedback without the need for another component to provide the phase shift. This means a simpler circuit can be used, which can facilitate greater integration and hence lower costs. By using piezoresistive resonators the need for an external crystal can be avoided, enabling greater integration and lower costs.

15 Claims, 2 Drawing Sheets

OSCILLATOR BASED ON PIEZORESISTIVE RESONATORS

This invention relates to oscillator circuits, and to MEMS structures having such circuits as well as to methods of manufacturing and operating them.

Certain crystals, most notably quartz, exhibit piezoelectricity, meaning that if force is applied to a crystal's faces, the crystal generates a voltage. Conversely, if an electrical voltage is applied to a crystal, it causes the crystal to mechanically deform. It is known to use this to make an oscillator. A crystal is placed into the feedback path of an amplifier circuit, so that it begins to oscillate at a frequency dependent primarily on the crystal's dimensions. This is a parallel resonant circuit, the crystal is placed in a parallel path around an amplifier or inverter.

It is also known to make sensors using MEMS (micro electro mechanical systems) techniques, based on the property of piezoresistivity. The sensing material in a piezoresistive pressure sensor is a diaphragm formed in a silicon substrate, which bends with applied pressure. A deformation occurs in the crystal lattice of the diaphragm because of that bending. This deformation causes a change in the band structure of the piezoresistors that are placed on the diaphragm, leading to a change in the resistivity of the material. This change can be an increase or a decrease according to the type of dopant of the resistors.

However, such piezoresistive resonating elements are not often used for oscillators as the conventional feedback arrangement is not effective because there is a 90° phase shift in the output of the piezoresistive element. This can be compensated by a phase shifter.

WO2004053431 shows an oscillator using a resonator using electrostatic (capacitive) actuation and piezo-resistive readout. Unfortunately, the piezo-resistive readout leads to a π/2 phase shift between input and output signal at its resonance frequency. This does not allow direct feedback of the resonator output to its input, which in the case of capacitive or piezo-electric read-out leads to oscillation.

An object of the invention is to provide improved oscillator circuits, and to MEMS structures having such circuits as well as to methods of manufacturing and operating them. According to a first aspect, the invention provides:

An oscillator circuit comprising a first and a second piezoresistive resonator, each having a resonant frequency, each resonator having an input for driving the resonator, and each resonator having its input coupled to an output of the other of the resonators, to provide feedback according to a resistance of the respective resonator. This exploits the phase shift between input and output of each resonator, to enable feedback without the need for another component to provide the phase shift. This means a simpler circuit can be used, which can facilitate greater integration and hence lower costs. By using piezoresistive resonators the need for an external crystal can be avoided, enabling greater integration and lower costs.

According to an embodiment of the first aspect of the invention, the outputs of the piezoresistive resonators may be fed directly to the respective inputs without amplification.

In embodiments according to the first aspect of the invention, the resonators may each be formed as a MEMS structure.

According to an embodiment of the first aspect of the invention, the piezoresistive resonators may be arranged in parallel. In that case, each resonator may have a series coupled resistor or choke, each output being taken from between the respective resonator and its series coupled resistor or choke.

In embodiments according to the first aspect of the invention, each piezoresistive resonator may comprise an elongate member arranged to oscillate along a longitudinal axis of the member. The piezoresistive resonators may each have electrostatic drive electrodes coupled to their respective inputs to drive the elongate members. According to particular embodiments, the elongate members may have a broader end, broader by a factor of 10 or at least a factor of 10 than a body of the elongate member, for use as an electrostatic drive electrode.

The oscillator circuit according to the first aspect of the invention may be suitable for use with a drive voltage of less than 4 volt. This may enable use with existing low voltage circuitry particularly for battery-powered devices.

Another aspect of the invention provides an integrated oscillator comprising a first and a second piezoresistive resonator, each having a resonant frequency, each piezoresistive resonator having an input for driving the piezoresistive resonator, and each piezoresistive resonator having its input coupled to an output of the other of the piezoresistive resonators, to provide feedback according to a resistance of the respective resonator. This can be used in a battery-powered device.

The present invention furthermore provides a battery-powered device comprising an oscillator circuit according to the first aspect of the invention or an integrated oscillator according to the second aspect of the invention.

Additional features will be described below which can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which.

Figure 1:
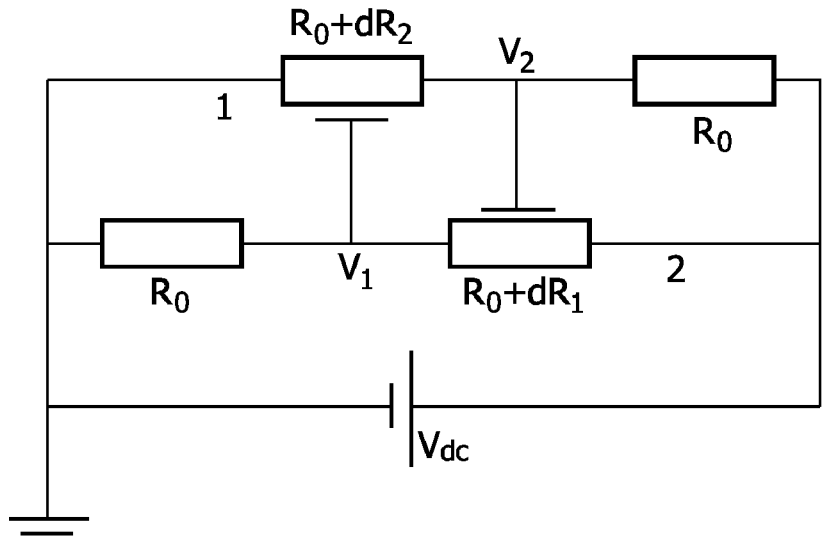
FIG. 1 shows a piezoresistive oscillator circuit according to an embodiment of the present invention.
Figure 2:
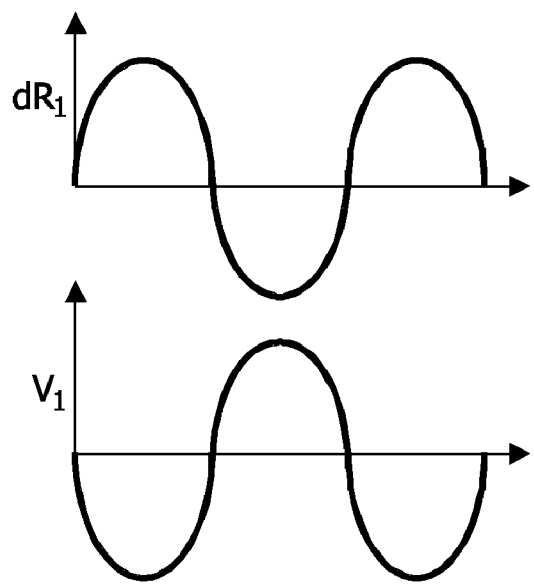
FIGS. 2 and 3 show variation of dR and V at resonance as a function of time.
Figure 3:
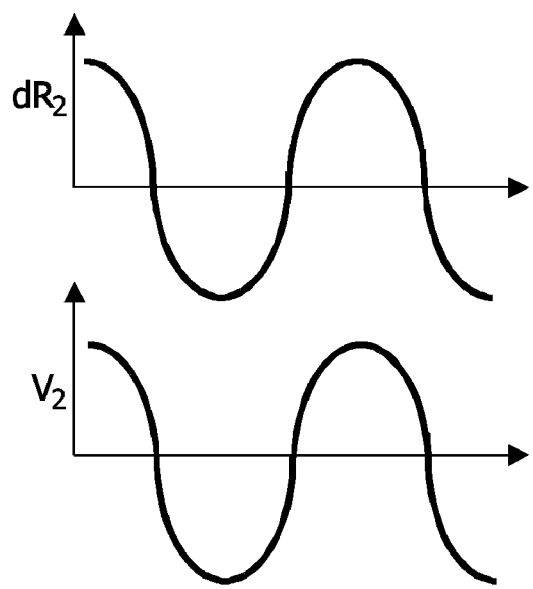

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Embodiments of the present invention exploit the piezoresistive effect to build and an oscillator circuit, such as a MEMS oscillator. In an aspect of the present invention an oscillator circuit has a first and a second piezoresistive resonator, each piezoresistive resonator having an input coupled to an output of the other of the piezoresistive resonators. The embodiments of the present invention can be realized using standard semiconductor, e.g. silicon processing techniques without the use of special materials, e.g. piezo-electric materials. It therefore enables a miniature single chip oscillator. The oscillator circuit according to the present invention is scalable without affecting oscillator performance and/or power consumption, allowing for small-scale implementation resulting in a high oscillating frequency. The predicted noise floor can be less than −145 dBc/Hz at 1 mW power consumption, which can rival the performance of a conventional quartz oscillator. Sustained oscillation can be achieved feeding the device at low voltage making it suitable for battery fed applications. Thus, the oscillator circuit according to the present invention may be used in a battery-powered device. Furthermore, in some embodiments the oscillator circuit does not need an amplifier to sustain the oscillation, as is the case for capacitive (MEMS) or piezo-electric (quartz) based oscillators.

Notable additional features include the outputs being fed directly to the respective inputs without amplification. Alternative embodiments can include amplification and still achieve some of the advantages. The piezoresistive resonators can, according to embodiments of the invention, each be formed as a MEMS structure. The piezoresistive resonators can, according to embodiments of the invention, be arranged in parallel, each piezoresistive resonator having a series coupled impedance such as a resistor or choke, each output being taken from between the respective resonator and its series coupled impedance, e.g. resistor or choke.

Each piezoresistive resonator can comprise an elongate member arranged to oscillate along a longitudinal axis of the member. The piezoresistive resonators can have electrostatic drive electrodes coupled to their respective inputs, to drive the elongate members. According to embodiments of the invention, the elongate oscillating member can have a broader end, broader by a factor of 10 or more than a body of the elongate member, for use as an electrostatic drive electrode.

The oscillator circuit according to embodiments of the invention can be suitable for use with a drive voltage of less than 4 volts, to enable use with existing low-voltage circuitry particularly for battery-powered devices.

FIG. 1 shows an oscillator circuit layout in accordance with an embodiment of the present invention in which two piezoresistive resonators are used to compensate for the $\pi/2$ phase shift of a single resonator. The oscillator circuit consists of 2 parallel branches. Each branch consists of a resonating resistor 1,2, labelled as $R_0+dR_1$, and $R_0+dR_2$, which form piezoresistive resonators as is described in WO2004/053431, for example, and a fixed resistor connected in series. When piezoresistive resonators 1,2 are vibrating at a frequency $\omega$, than their resistance is given by, $R_{1,2}=R_0(1+\alpha \sin \omega t)$ with $$\alpha = \frac{dR_{max}}{R_0}$$

The voltages $V_{1,2}$ are than given by, $$V_1 = V_{dc}\frac{1}{2+\alpha\sin\omega t} \approx \frac{V_{dc}}{2}\left(1 - \frac{\alpha}{2}\sin\omega t\right); \quad (1)$$
$$V_2 = V_{dc}\frac{1+\alpha\sin\omega t}{2+\alpha\sin\omega t} \approx \frac{V_{dc}}{2}\left(1 + \frac{\alpha}{2}\sin\omega t\right)$$

when the fixed resistor has a value equal to $R_0$.

$V_1$ is now fed back to the piezoresistive resonator in branch 2, which leads to a phase shift of $\Phi_1=-\pi/2$ in $dR_2$ at resonance $\omega_0$. The phase difference, $\Phi_2$ between $dR_2$ and $V_2$ is zero according to equation (1). When $V_2$ is fed back to the piezoresistive resonator in branch 1, then the phase in $dR_1$ is again shifted $\Phi_3=-\pi/2$ with respect to $V_2$. Between $dR_1$ and $V1$ a phase shift, $\Phi_4=\pi$ is encountered according to equation (1). The total phase shift around the loop is $\Phi_{tot}=\Phi_1+\Phi_2+\Phi_3+\Phi_4=0$, which will result in sustained oscillation when the loop gain, $$G(\omega_0) = \frac{V_1}{V_2} = 1.$$

Figure 4:
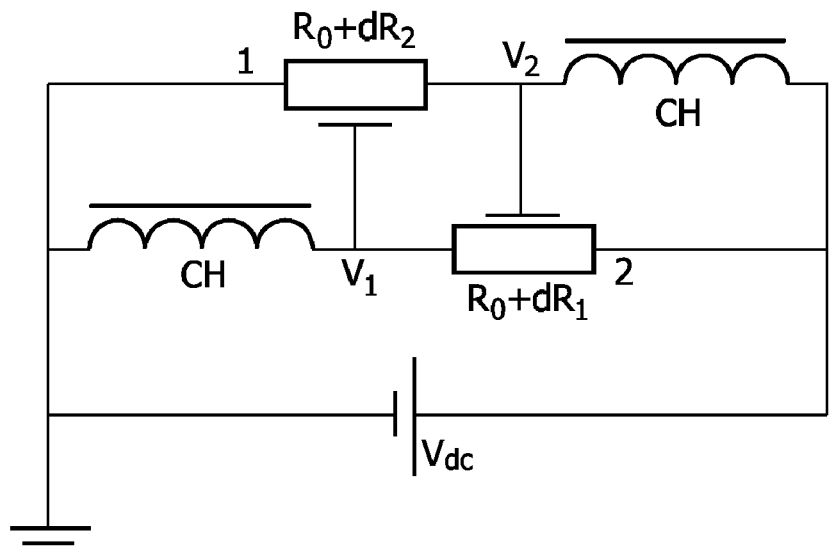
FIG. 4 shows a piezoresistive oscillator circuit with choke coils.

The oscillator circuit as described in FIG. 1 can be further improved by replacing the fixed resistors with choke coils CH1, CH2, as is shown in FIG. 4. In this case, less power is consumed since no dissipation occurs in the coils. In this case $V_1$ and $V_2$ are given by, $$V_1 = V_{dc}\alpha \sin \omega t; V_2 = V_{dc}(1+\alpha \sin \omega t) \quad (2)$$

Figure 5:
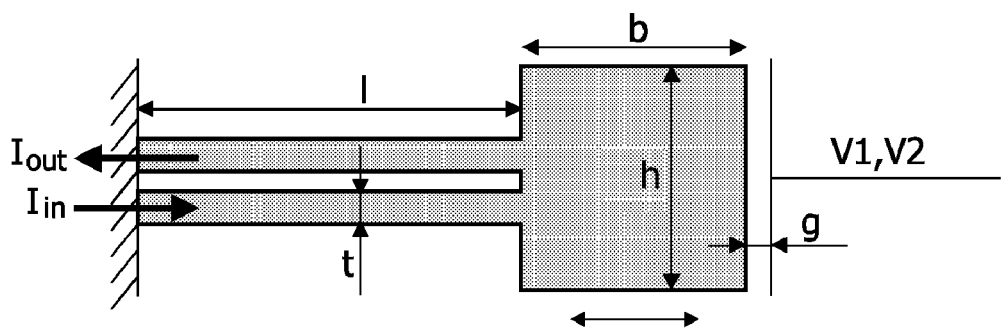
FIG. 5 shows a plan view of piezoresistive resonator layout as is described in WO2004/053431.

The loop gain at resonance for the circuit shown in FIG. 4 is determined by the relative change in resistance $$\frac{dR}{R_{1,2}} = \alpha\sin\omega t$$

as a result of a voltage $V_{2,1}$. The voltage $V_{2,1}$ generates an electrostatic $F_{el}$ on the resonator of magnitude, $$F_{el} = V_{1,2}V_{dc}\frac{\varepsilon_0 bh}{2g^2}, \quad (3)$$

in which b is the electrode width, h the electrode height, and g the gap between the electrode and the resonator, as is depicted in FIG. 5. This figure shows that the device has an elongate oscillating member with a body formed of two beams of width t, with a broader part at one end having much greater width b. The broader end is shown as a square, but other shapes are possible, for use as the electrostatic drive electrode. The force $F_{el}$ generates a strain c in the resonator beam of magnitude, $$\varepsilon = \frac{F_{el}}{2E \cdot t \cdot h} \quad (4)$$

Combining equation (3) and (4) yields, $$\varepsilon = \frac{\varepsilon_0}{4E} \frac{b}{tg^2} V_{dc} V_{1,2} \quad (5)$$

At resonance $\epsilon$ is amplified by the quality factor, Q. The relative change in resistance is proportional with the strain and is given by, $$\frac{dR}{R} = K\varepsilon \quad (6)$$

in which K is the piezo resistive gauge factor. Combining equations (2), (5), and (6) gives $$\frac{V_{2,1}}{V_{dc}} = K \frac{\varepsilon_0}{4E} \frac{b}{tg^2} Q V_{dc} V_{1,2} \quad (7)$$

$$G = \left|\frac{V_{2,1}}{V_{1,2}}\right| = V_{dc}^2 \frac{\varepsilon_0 K}{4E} \frac{b}{tg^2} Q \quad (8)$$

Oscillation will sustain when G>1, therefore $$\frac{b}{t}\left(\frac{V_{dc}}{g}\right)^2 > \frac{4E}{\varepsilon_0 KQ} \quad (9)$$

For a Si resonator processed in n-type 1 Ω·cm silicon, which is oriented parallel to the (100) axis E=130 GPa and K=−151. Assuming Q=$10^5$ [see Mattila et. al., Sensors and Actuators A, 3204 (2002)1-6] then, $$\left|\frac{4E}{\varepsilon_0 KQ}\right| = 3.8 \times 10^{15} V^2 m^{-2} \quad (10)$$

Assuming g=0.2 μm and $V_{dc}$=3.6V (=battery voltage) then, $$\frac{b}{t} > 12 \quad (11)$$

which is within range of manufacturing capabilities. Therefore, sustained oscillation can be achieved at battery voltage.

Figure 6:
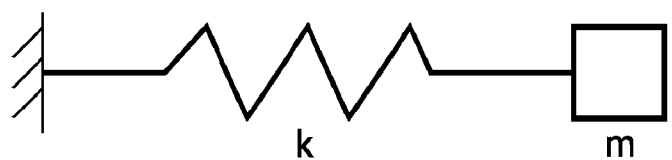
FIG. 6 shows the resonator of FIG. 5 modelled with a spring-mass system.

As shown in FIG. 6, the resonance frequency of the piezoresistive resonator 1, 2 can be approximated by modelling its geometry as a mass spring system in which the spring constant k, proof mass m, and resonance frequency $\omega_0$ are given by, $$k = \frac{2th}{l} E \quad (12)$$

-continued $$m = b^2 h \rho$$

$$\omega_0 = \sqrt{\frac{k}{m}} = \frac{1}{b}\sqrt{\frac{2t}{l}\frac{E}{\rho}}$$

When the resonator is scaled in x, y, and z direction with a factor γ it can be seen from equation (12) that the resonance frequency $\omega_0$ scales with $\gamma^{-1}$. From equation (9) it can be seen that the oscillation condition does not depend on the scaling factor γ. Therefore it is concluded that sustained oscillation is independent of resonator size, which allows for small scale implementation resulting in a high oscillation frequency. This conclusion does not hold for a capacitive MEMS oscillator. For a capacitive resonator its impedance increases when its size decreases. In this case, more amplifier gain is needed in order to sustain the oscillation when going to higher oscillating frequencies.

The oscillator noise floor is determined by the Johnson-Nyquist noise generated in the resistor and is given by, $V_{noise}^2 = 4k_B T R_0 \cdot \Delta f$. The average voltage swing $V_{1,2}$ is given by, $V_{1,2}^2 = V_{dc}^2 \alpha_{max}^2 / 2$. The time average power consumption of the oscillator is given by, $$\bar{P} = 2\frac{V_{dc}^2}{R_0}.$$

This results in a noise floor given by, $$\left(\frac{V_{noise}}{V_{1,2}}\right)^2 = \frac{16 k_B T \Delta f}{\bar{P} \alpha^2} \quad (13)$$

Assuming T=300K, P=1 mW, and $\alpha_{max}$>0.1 results in a phase noise floor (=half total noise floor) of <−145 dBc/Hz, which rivals the noise floor performance of a quartz oscillator. From equation (13) it can be seen that the noise floor does not depend on resonator dimensions. This means the noise floor does not change when scaling the piezoresistive resonator. This property allows for high frequency operation without degrading the phase noise floor or without added power consumption.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. An oscillator circuit comprising a first and a second piezoresistive resonator, each having a resonant frequency, each resonator having an input for driving the resonator, and each resonator having its input coupled to an output of the other of the resonators, wherein each resonator is driven by the output of the other of the resonators to provide feedback according to a resistance of the respective resonator.

2. The circuit of claim 1, the outputs being fed directly to the respective inputs without amplification.

3. The circuit of claim 1, the resonators each being formed as a MEMS structure.

4. The circuit of claim 1, the resonators being arranged in parallel.

5. The circuit of claim 4, each resonator having a series coupled resistor or choke, each output being taken from between the respective resonator and its series coupled resistor or choke.

6. The circuit of claim 1, each resonator comprising an elongate member arranged to oscillate along a longitudinal axis of the member.

7. The circuit of claim 6, the resonators each having electrostatic drive electrodes coupled to their respective inputs, to drive the elongate members.

8. The circuit of claim 7, the elongate oscillating member having a broader end, broader by a factor of 10 or more than a body of the elongate member, for use as an electrostatic drive electrode.

9. The circuit of claim 1, suitable for use with a drive voltage of less than 4 volts.

10. An integrated oscillator comprising a first and a second piezoresistive resonator, each having a resonant frequency, each piezoresistive resonator having an input for driving the resonator, and each piezoresistive resonator having its input coupled to an output of the other of the resonators, wherein each resonator is driven by the output of the other of the resonators to provide feedback according to a resistance of the respective resonator.

11. A battery powered device comprising an oscillator circuit, said oscillator circuit including a first and a second piezoresistive resonator, each having a resonant frequency, each resonator having an input for driving the resonator, and each resonator having its input coupled to an output of the other of the resonators, wherein each resonator is driven by the output of the other of the resonators to provide feedback according to a resistance of the respective resonator.

12. The battery powered device of claim 11, wherein each resonator includes a series coupled resistor or choke, each output being taken from between the respective resonator and its series coupled resistor or choke.

13. The battery powered device of claim 11, wherein each resonator includes an elongate member arranged to oscillate along a longitudinal axis of the member.

14. The battery powered device of claim 13, wherein each resonator includes an electrostatic drive electrode coupled to the input.

15. The battery powered device of claim 11, wherein the elongate member includes a broader end, broader by a factor of 10 or more than a body of the elongate member, for use as an electrostatic drive electrode.

* * * * *